(12) United States Patent
Kuo

(10) Patent No.: US 11,528,825 B2
(45) Date of Patent: Dec. 13, 2022

(54) SERVER RACK ASSEMBLY

(71) Applicant: Mitac Computing Technology Corporation, Taoyuan (TW)

(72) Inventor: Chih-Ming Kuo, Taoyuan (TW)

(73) Assignee: Mitac Computing Technology Corporation, Taoyuan (TW)

( * ) Notice: Subject to any disclaimer, the term of this patent is extended or adjusted under 35 U.S.C. 154(b) by 380 days.

(21) Appl. No.: 17/003,314

(22) Filed: Aug. 26, 2020

(65) Prior Publication Data

US 2021/0084789 A1 Mar. 18, 2021

(30) Foreign Application Priority Data

Sep. 16, 2019 (TW) .................................. 108133263

(51) Int. Cl.
*H05K 7/18* (2006.01)
*H05K 7/14* (2006.01)
(52) U.S. Cl.
CPC ........... *H05K 7/183* (2013.01); *H05K 7/1489* (2013.01); *H05K 7/1492* (2013.01)

(58) Field of Classification Search
CPC ........ H05K 7/1488; H05K 7/183; H05K 7/14; H05K 7/1489; H05K 7/18; H05K 7/1492
See application file for complete search history.

(56) References Cited

U.S. PATENT DOCUMENTS

| 9,622,373 B1* | 4/2017 | Sarti | ........................ H02M 3/04 |
| 10,172,453 B1* | 1/2019 | Redfern | .................. A47B 47/00 |
| 10,368,463 B1* | 7/2019 | Kelley | ............... H05K 7/20009 |

\* cited by examiner

*Primary Examiner* — Ko H Chan
(74) *Attorney, Agent, or Firm* — MLO, a professional corp.

(57) ABSTRACT

A server rack assembly includes a pair of mounting units each including a panel, an adjustment plate, and rails. The panel has a first panel flange to connect a front support post. The adjustment plate is movably connected to the panel for connecting a rear support post and is adjustable to suit varying distances between front and rear support posts. The rails are detachably mounted on the panel; a gap between two rails is adjustable to accommodate different server devices.

20 Claims, 12 Drawing Sheets

SERVER RACK ASSEMBLY

CROSS-REFERENCE TO RELATED APPLICATION

This application claims priority to Taiwanese Patent Application No. 108133263, filed on Sep. 16, 2019.

FIELD

The disclosure relates to a rack assembly, and more particularly to a server rack assembly.

BACKGROUND

The specification of server's heights usually involves the symbol "U" as the unit of height or dimension standardized by Electronic Industries Alliance (EIA); 1 U is equal to 1.75 inches or 44.45 mm. Therefore, the unit "U" is also used in manufacturing server cabinets and server racks for designing the size of the server cabinets and the height between support rails of the server racks.

In recent years, the Open Compute project (OCP) has developed new standard specifications which allow easy coordination of peripheral components required by servers, such as CPUs, memories, hard drives and PCI-E devices, etc. In the specifications of the OCP, 1 OU is used in place of 1 U. As 1 OU is about 48 mm, the usable interior spaces of server cabinets or racks are increased.

However, because the standards of the EIA and OCP are different, the existing server-storage cabinet manufactured based on the EIA standard is incompatible with the servers fabricated based on the OCP standard, thereby requiring hardware replacement, which increases costs.

SUMMARY

Therefore, an object of the disclosure is to provide a server rack assembly that is compatible with server cabinets and server devices designed with different standardized specifications.

According to one aspect of the disclosure, a server rack assembly is mountable inside a server cabinet, and includes two post units spaced apart from each other in a left-right direction and each including a front support post and a rear support post spaced apart from each other in a front-rear direction. The server rack assembly includes a pair of mounting units, at least one bridge member, a power supply module, and a fastening unit.

The mounting units are configured to be respectively connected to the post units. Each of the mounting units includes a panel, an adjustment plate, and a plurality of rails.

The panel has a panel plate, a first panel flange and a second panel flange. The first and second panel flanges bend from the panel plate in two opposite directions. The first panel flange is configured to connect one of the front and rear support posts. The second panel flange has a positioning stud and a flange through hole which are disposed one above the other.

In the panel of one of the mounting units, the positioning stud is disposed above the flange through hole. In the panel of the other one of the mounting units, the positioning stud is disposed below the flange through hole.

The adjustment plate is connected to the panel plate. The adjustment plate is configured to connect the other one of the front and rear support posts.

The rails are detachably mounted on an inner surface of the panel at different heights. The inner surfaces of the panels of the mounting units face toward each other. Two adjacent ones of the rails on the panel have a gap therebetween that is adjustable to accommodate different heights of server devices. Each of the rails on the panel of one of the mounting units corresponds in position in the left-right direction to one of the rails on the panel of the other one of the mounting units to cooperatively support one server device.

The at least one bridge member is connected to the second panel flanges of the panels of both of the mounting units in a bridging manner. The at least one bridge member has two opposite bridge ends and a bridge body interconnected between the bridge ends. Each of the bridge ends has a stud-receiving hole to receive the positioning stud, and a bridge through hole to align with the flange through hole. The stud-receiving hole and the bridge through hole are disposed one above the other. In one of the bridge ends, the stud-receiving hole is disposed above the bridge through hole. In the other one of the bridge ends, the stud-receiving hole is disposed below the bridge through hole.

The power supply module includes an electrical busbar mounted to the bridge body and extends in the top-bottom direction. The electrical busbar has a terminal member for connecting to a power supply device.

The fastening unit includes at least two fasteners. Each of the at least two fasteners extends through and securing together the flange through hole of the panel of one of the mounting units and the bridge through hole of one of the bridge ends.

According to another aspect of the disclosure, a server rack assembly includes two post units, a pair of mounting units, at least one bridge member, and a power supply module.

The post units are spaced apart from each other in a left-right direction. Each of the post unit includes a front support post and a rear support post spaced apart from each other in a front-rear direction.

The mounting units are respectively connected to the post units. Each of the mounting units includes a panel, an adjustment plate, and a plurality of rails.

The panel has a panel plate, a first panel flange and a second panel flange. The panel plate of the panel of one of the mounting units has an inner surface that faces the inner surface of the panel plate of the other one of the mounting units. The first panel flange is connected to one of the front and rear support posts.

The adjustment plate is movably connected to an outer surface of the panel plate opposite to the inner surface and is adjustable in position relative to the panel plate. The adjustment plate is connected to the other one of the front and rear support posts.

The rails are mounted on the inner surface of the panel at different heights. Each of the rails on the panel of one of the mounting units corresponds in position in the left-right direction to one of the rails on the panel of the other one of the mounting units to cooperatively support a server device.

The at least one bridge member is connected to the second panel flanges of the panels of the mounting units in a bridging manner.

The power supply module includes an electrical busbar mounted to the bridge body and extending in a top-bottom direction. The electrical busbar has a terminal member.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
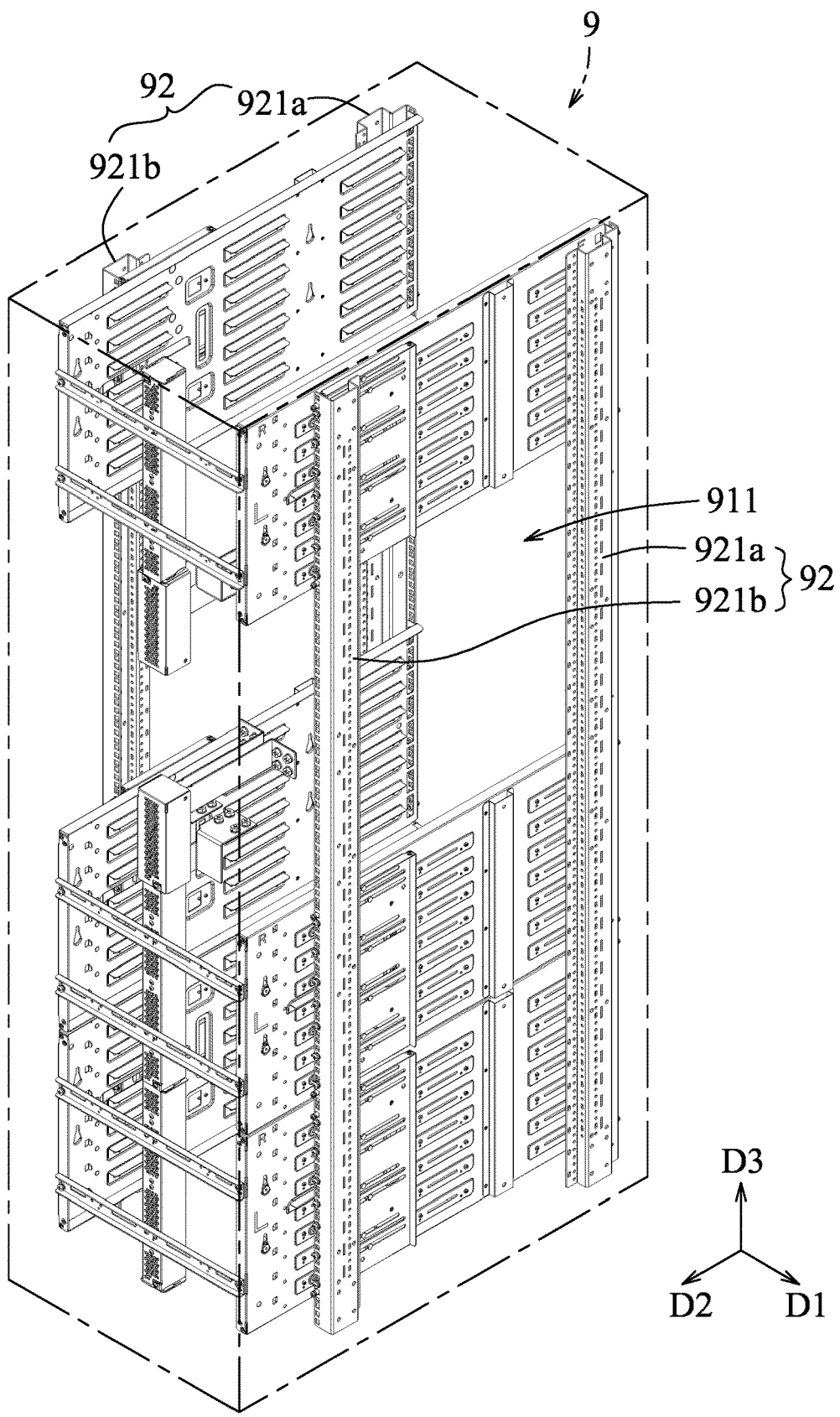
FIG. 1 is a perspective view illustrating a server rack assembly according to an embodiment of the disclosure disposed in a cabinet.
Figure 2:
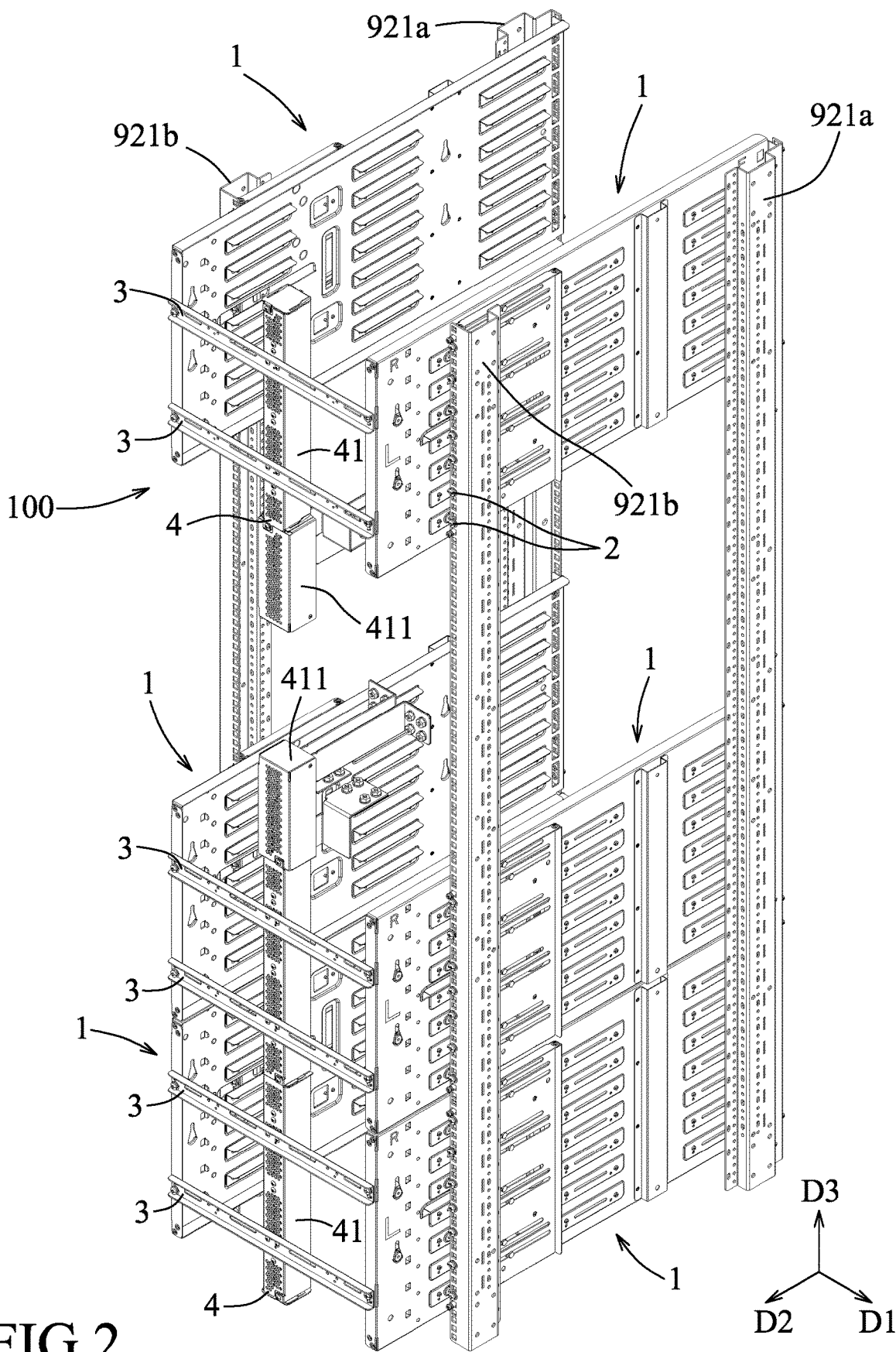
FIG. 2 is a view similar to FIG. 1, but without the cabinet.

FIGS. 1 and 2 illustrate a server rack assembly 100 of an embodiment according to the disclosure for mounting in an existing cabinet 9 to install server devices (not shown) and power supply devices (not shown) in an accommodating space 911 of the cabinet 9. The server rack assembly 100 includes multiple pairs of mounting units 1, a plurality of fastening units 2, a plurality of bridge members 3, and a plurality of power supply modules 4.

In the cabinet 9, there are two post units 92 that are spaced apart from each other in a left-right direction (D1). Each post unit 92 includes a front support post 921a and a rear support post 921b spaced apart from each other in a front-rear direction (D2). Each of the front and rear support posts 921a, 921b has a plurality of post through holes 922 (see FIG. 3). The existing cabinet 9 originally contains slide rails (not shown) which are attached to the post units 92 and movable in the front-rear direction (D2) for installation of server devices (not shown). After removal of the slide rails, the server rack assembly 100 can be directly secured to the existing cabinet 9.

Figure 3:
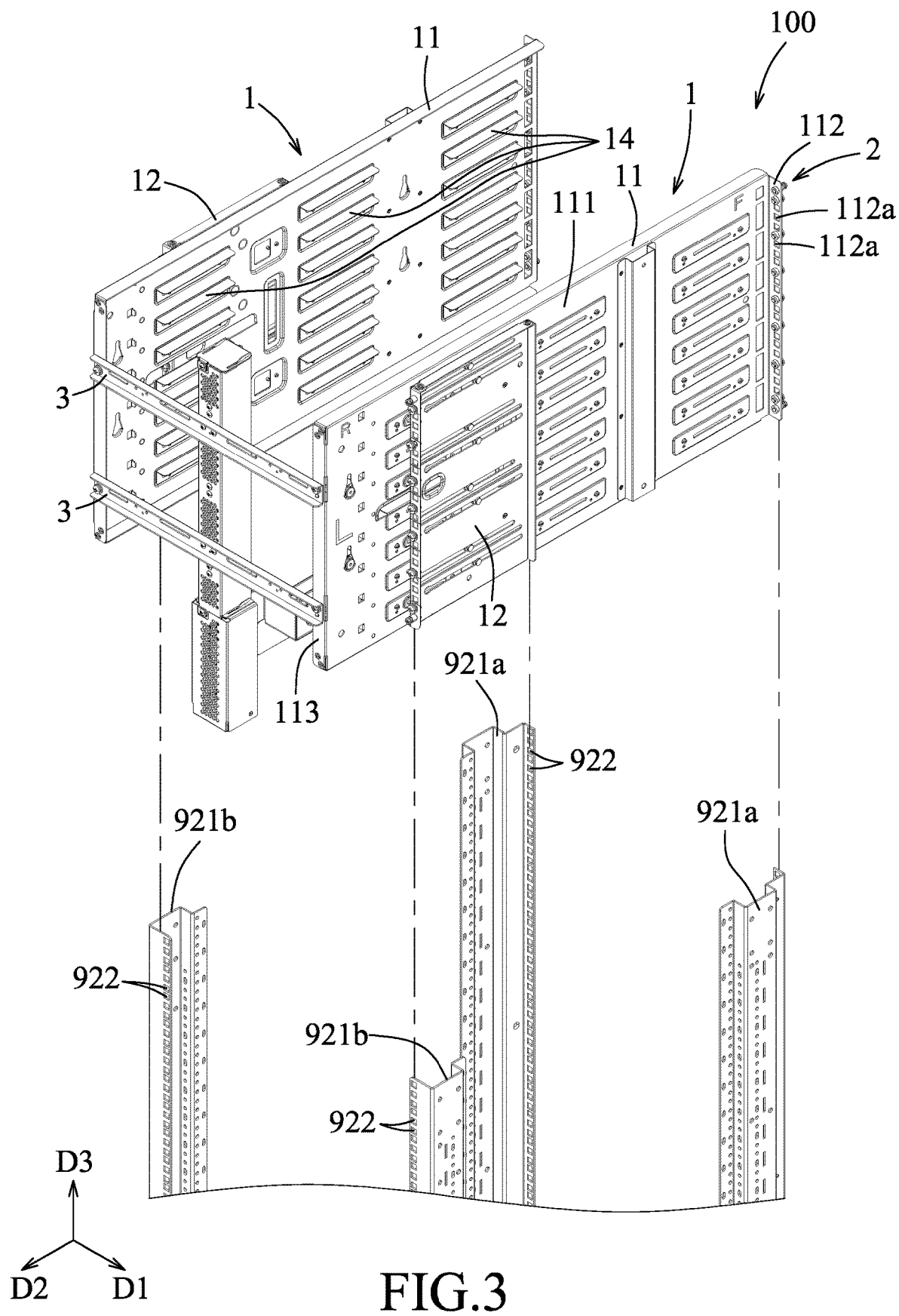
FIG. 3 is a fragmentary exploded perspective view illustrating an upper portion of the embodiment.

FIG. 3 illustrates an upper portion of the server rack assembly 100, in which only one pair of the mounting units 1 are shown. The mounting units 1 are respectively connected to the post units 92. As shown in FIGS. 4 to 7, each mounting unit 1 includes a panel 11, an adjustment plate 12, two handles 13, and a plurality of rails 14.

The panel 11 has a panel plate 111, a first panel flange 112 and a second panel flange 113. The first and second panel flanges 112, 113 respectively bend from two opposite ends of the panel plate 111 in two opposite directions.

In this embodiment, the panel plate 111 of the panel 11 of one of the mounting units 1 has an inner surface that faces the inner surface of the panel plate 111 of the other one of the mounting units 1. Further, the panel plate 111 has an outer surface opposite to the inner surface thereof, a plurality of guiding studs 111 for installation of the adjustment plate 12, and a plurality of coupling recesses 111b for installation of the rails 14. The guiding studs 11a protrude from the outer surface and are spaced apart in a top-bottom direction (D3). Two adjacent ones of the guiding studs 111a are not in line with each other in the top-bottom direction (D3). The coupling recesses 111b are formed in the inner surface of the panel plate 111, and are spaced apart in row alignment from each other in the top-bottom direction (D3).

The first panel flange 112 is connected to the front support post 921a of one of the post units 92. The first panel flange 112 has a plurality of post connecting holes 112a spaced apart from each other in the top-bottom direction (D3) and aligning with the post through holes 922 of the front support post 921a.

Figure 4:
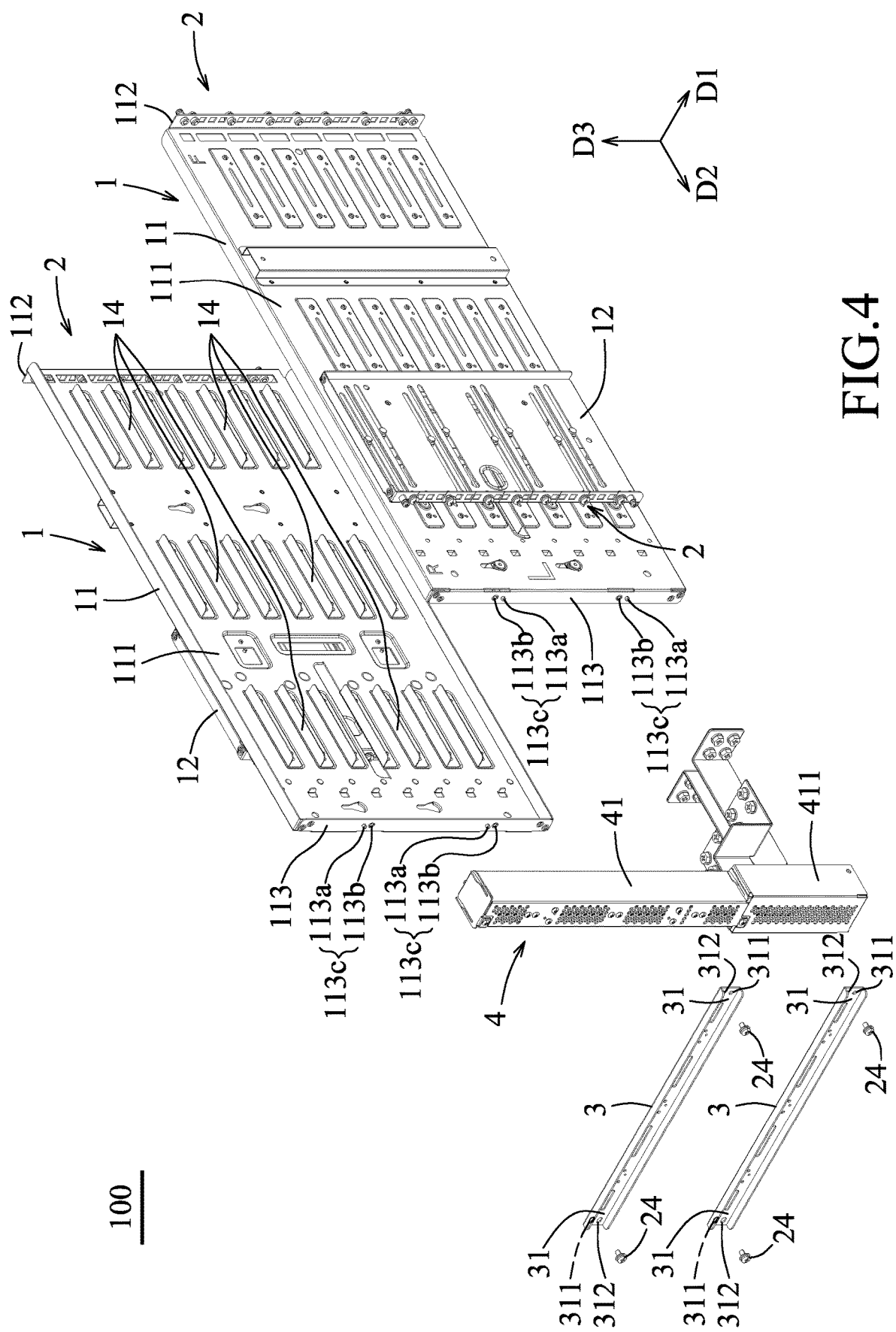
FIG. 4 is another exploded perspective view of the embodiment illustrating mounting units, bridge members, and a power supply module of the server rack assembly.
Figure 5:
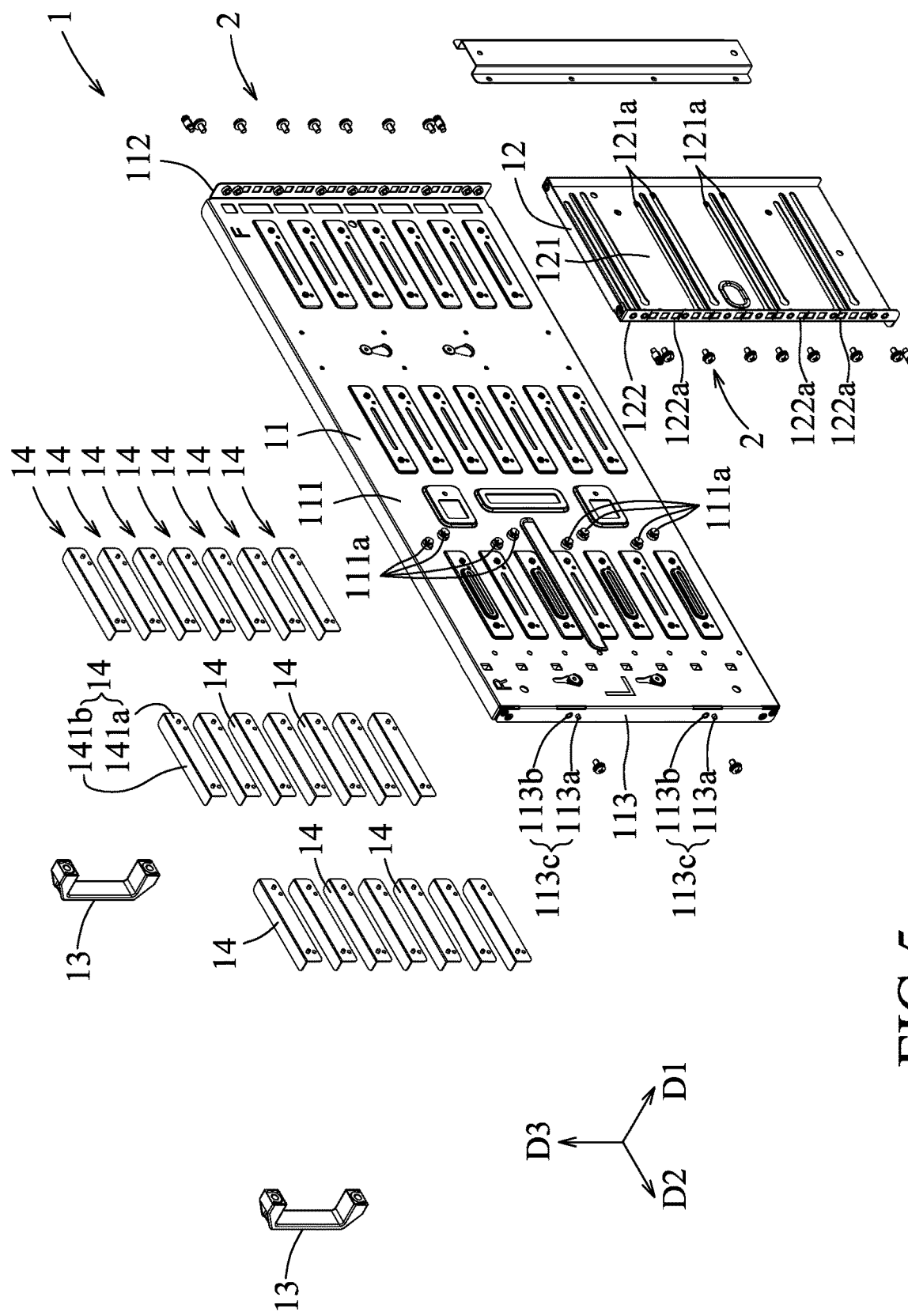
FIG. 5 is still another exploded perspective view of the embodiment illustrating one of the mounting units in a disassembled state.
Figure 6:
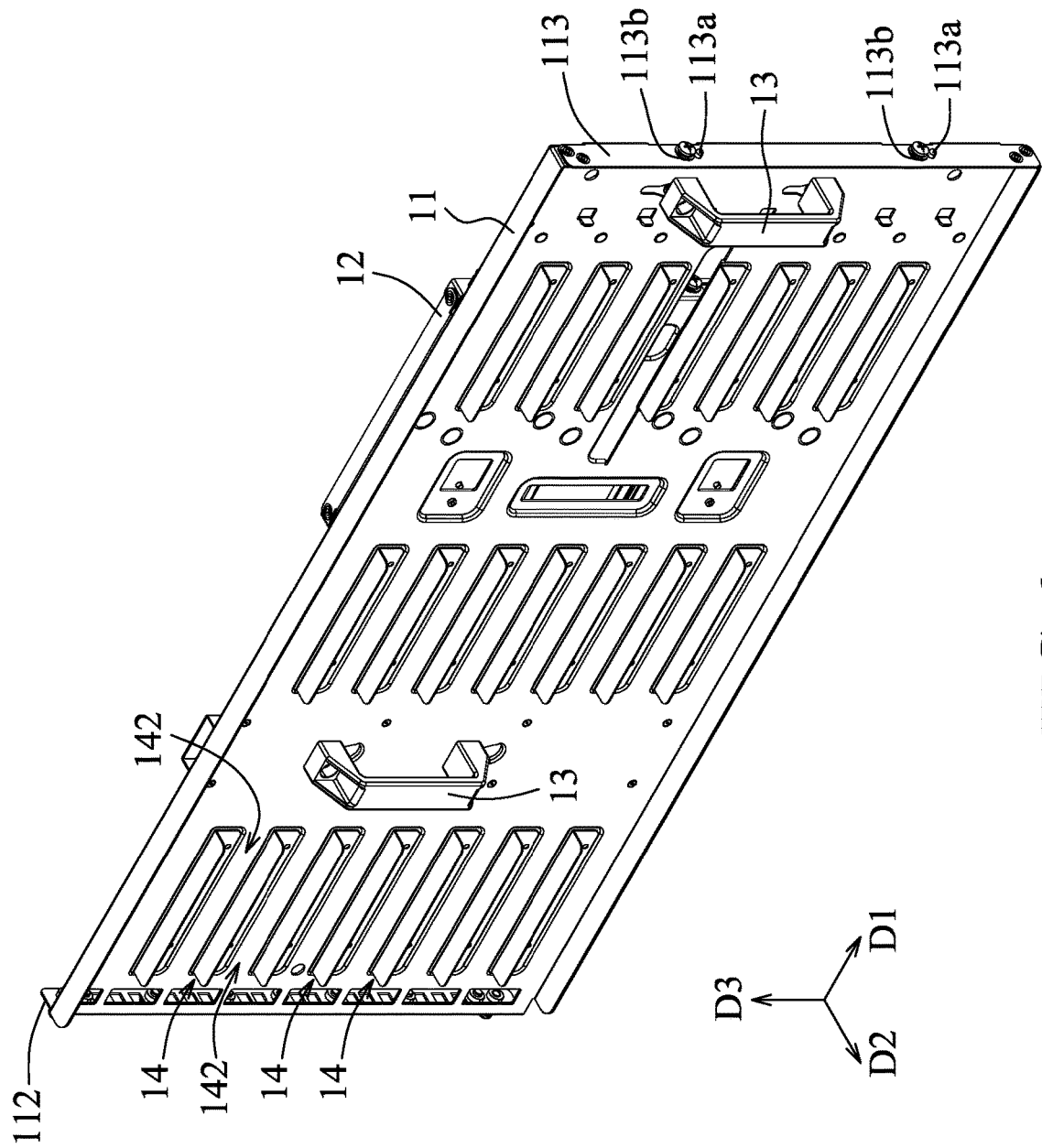
FIG. 6 is a perspective view illustrating one of the mounting units in an assembled state.
Figure 7:
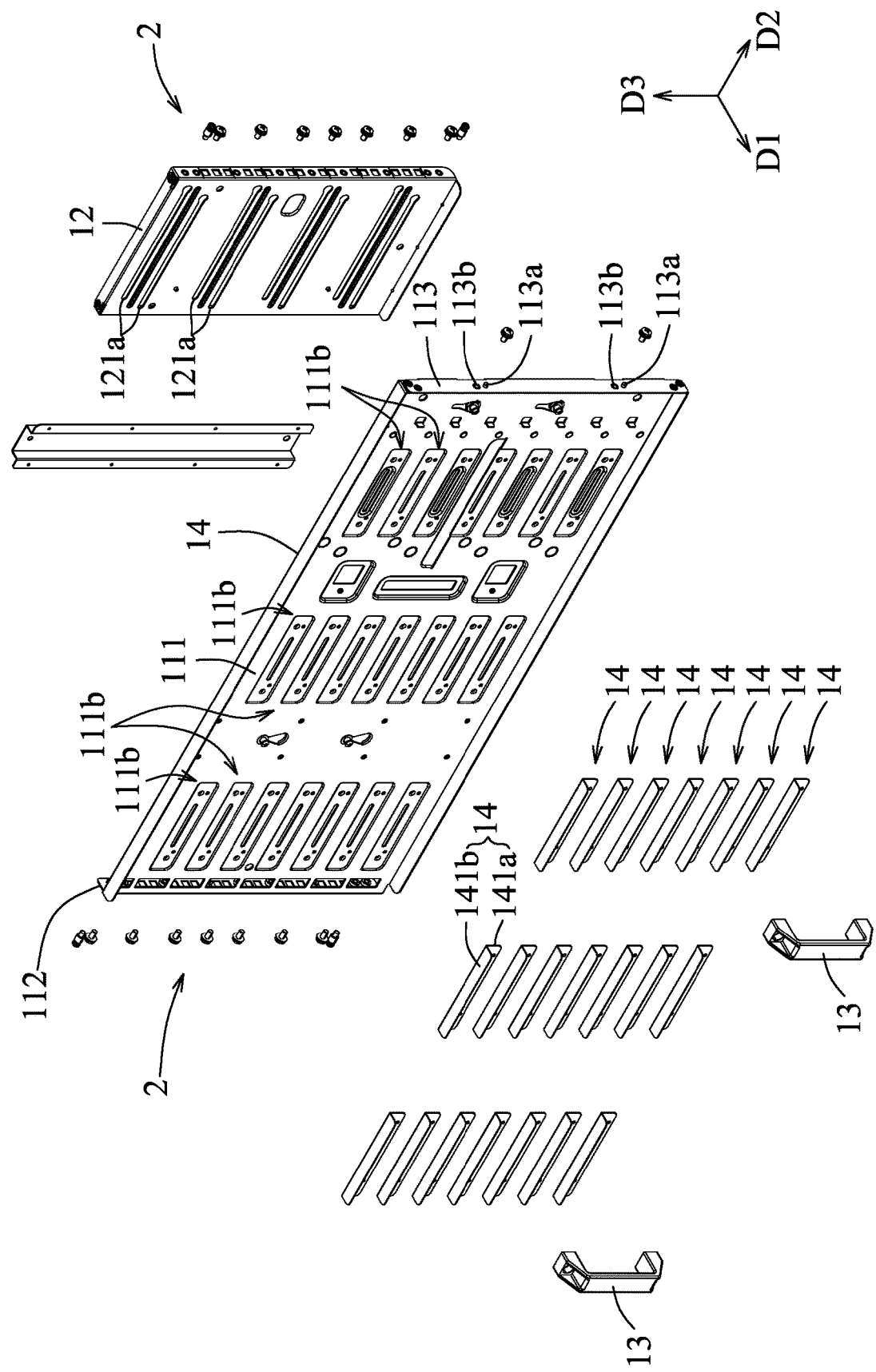
FIG. 7 is the same view as FIG. 5, but viewed in a different angle.
Figure 8:
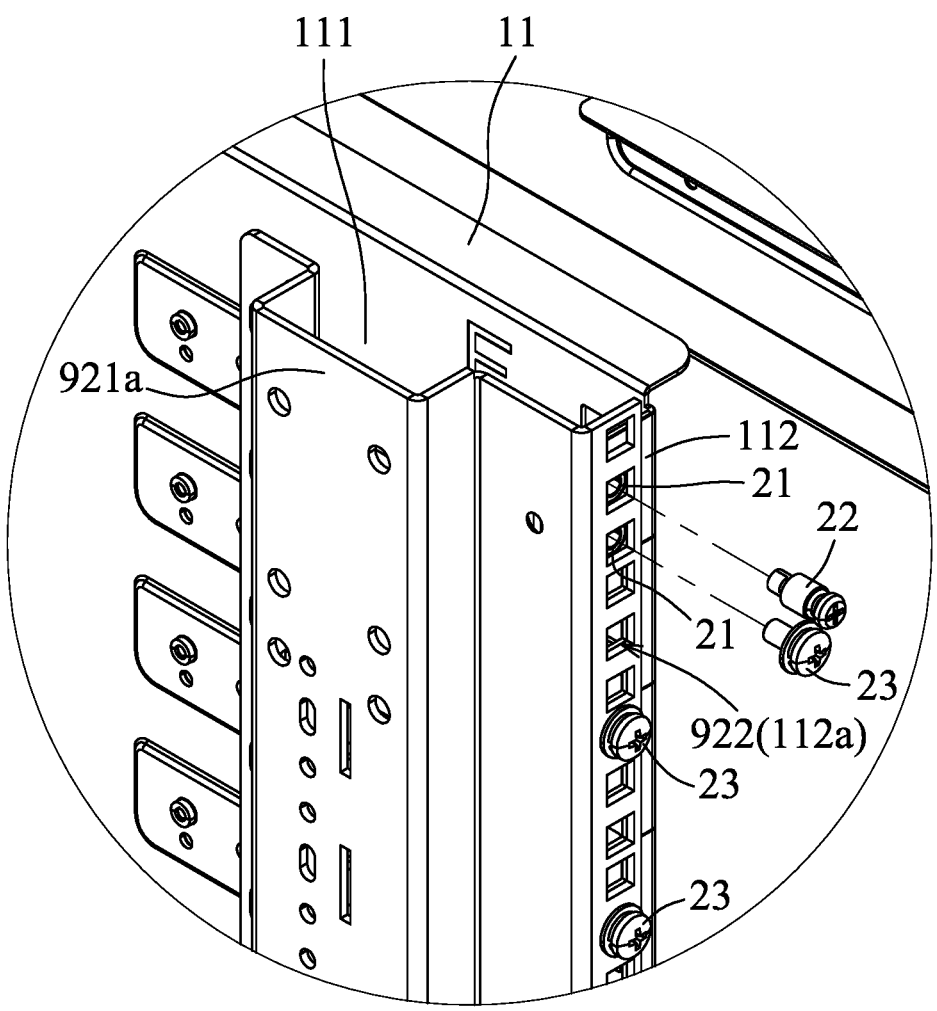
FIG. 8 is an enlarged perspective view illustrating a panel connected to a front support post by fasteners.
Figure 9:
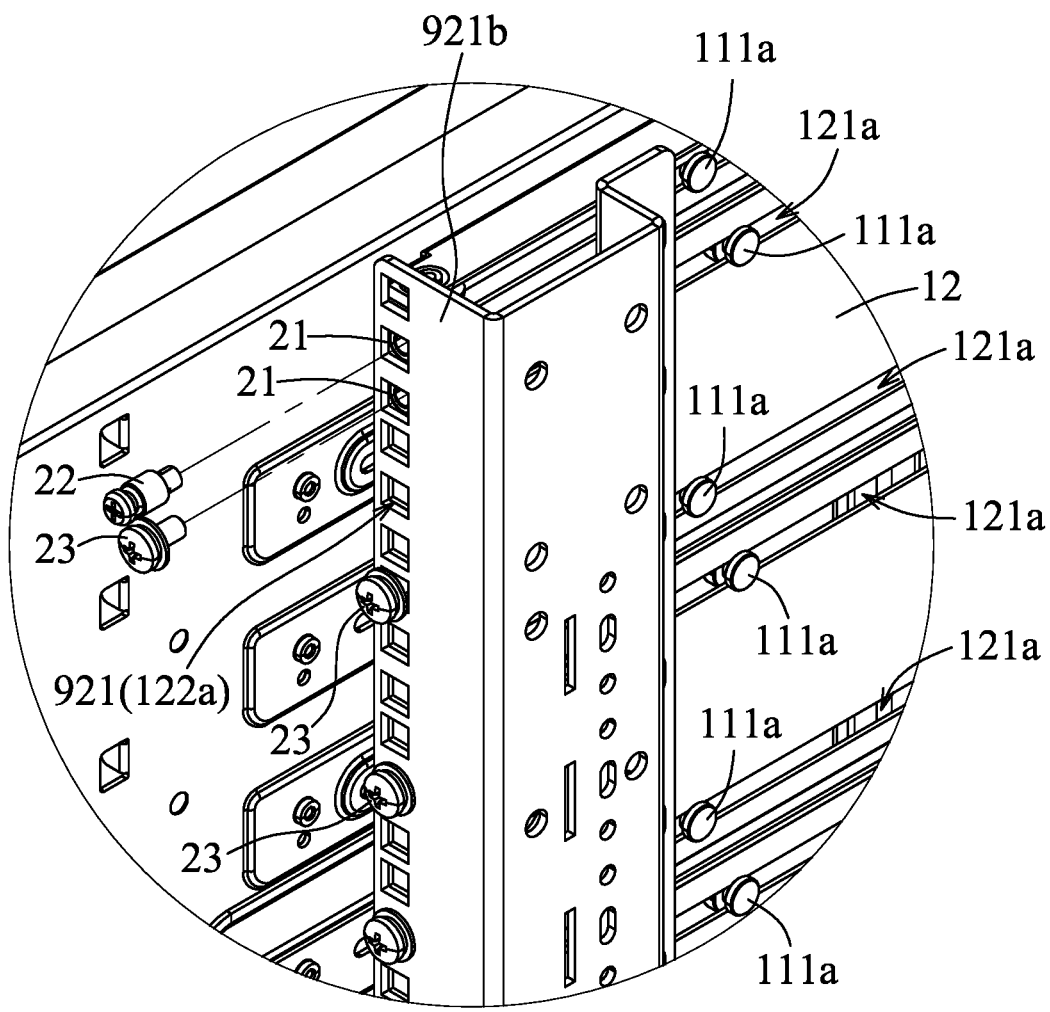
FIG. 9 is an enlarged perspective view illustrating an adjustment plate movably connected to the panel and fixed to a rear support post.

The second panel flange 113 has two positioning sets 113c spaced apart from each other in the top-bottom direction (D3). Each positioning set 113c has a positioning stud 113a and a flange through hole 113b. The positioning stud 113a and the flange through hole 113b of each positioning set 113c are adjacent to each other and are disposed one above the other. As shown in FIG. 4, in the panel 11 of one of the mounting units 1, the positioning stud 113a is disposed above the flange through hole 113b. In the panel 11 of the other one of the mounting units 1, the positioning stud 113a is disposed below the flange through hole 113b. While the number of the positioning set 113c of each mounting unit 1 is two in this embodiment, the number of the positioning sets 113c of each mounting unit 1 may be one or more than two.

Referring back to FIGS. 3 to 5, the adjustment plate 12 is movably connected to the outer surface of the panel plate 111 and is adjustable in position relative to the panel plate 111. The adjustment plate 12 is connected to the rear support post 921b. In this embodiment, the adjustment plate 12 has a plate portion 121, a plurality of sliding grooves 121a formed in the plate portion 121 and elongated in the front-rear direction (D2), and a post-connecting portion 122 bending outwardly from an end of the plate portion 121. The sliding grooves 121a are spaced apart from each other in the top-bottom direction (D3). The guiding studs 111a of the panel 11 extend through the sliding grooves 121a of the adjustment plate 12. The adjustment plate 12 is movable along a path formed by the sliding grooves 121a in the front-rear direction (D2) relative to the panel 11 to adjust the position of the adjustment plate 12 on the panel 11. The post-connecting portion 122 has a plurality of post connecting holes 122a which are spaced apart in the top-bottom direction (D3) and able to align with the post through holes 922 of the rear support post 921b.

During assembling the server rack assembly 100, the first panel flange 112 of the panel 11 is first secured to the front support post 921a by the fastening unit 2. Then, the adjustment plate 12 is moved in the front-rear direction (D2) relative to the panel 11 to adjust the position of the post-connecting portion 122 thereof for complying with the distance between the front and rear support posts 921a, 921b of the cabinet 9 having different sizes. After adjustment, the post-connecting portion 122 of the adjustment plate 12 is secured to the rear support post 921b by the fastening unit 2.

The handles 13 are detachably mounted on the inner surface of the panel plate 111 to facilitate handling of the panel 11 during assembly of the panel 11 to the front and rear support posts 921a, 921b. After assembly is completed, the handles 13 are removed. While the number of the handles 13 of each mounting unit 1 is two in this embodiment, the number of the handles 13 may be one or more than two.

As shown in FIGS. 4 to 7, the rails 14 are detachably mounted on the inner surface of the panel 11 at different heights. Two adjacent ones of the rails 14 therebetween have a gap 142 which is adjustable. In this embodiment, each rail 14 has a coupling portion 141a and a protruding portion 141b bending from the coupling portion 141a for supporting a server device. The protruding portion 141b of each rail 14 on the panel 11 of one of the mounting units 1 corresponds in position along the left-right direction (D1) to the protruding portion 141b of one of the rails 14 on the panel 11 of the other mounting unit 1 to support a server device.

The coupling recesses 111b are disposed at different height on the panel 11. The number of the coupling recesses 111b in the panel 11 is greater than or equal to the number of the rails 14. The coupling portion 141 of each rail 14 is detachably fixed in one of the coupling recesses 111b. The coupling portions 141 of adjacent two rails 14 are respectively fixed in two coupling recesses 111b disposed at different heights which are selected to adjust the gap between adjacent two rails 14.

Based on the quantity and heights of the server devices, the position of each rail 14 relative to the panel 11 can be adjusted by selecting one of the coupling recesses 111b at suitable height for attachment of the coupling portion 141 of the rail 14. As the height of each rail 14 on the panel 11 is adjustable, the height of the gap 142 between two adjacent rails 14 is also adjustable to suit the height of a server device to be installed. As the number of the rails 14 assembled on the panel 11 may be varied, the quantity of server devices to be installed may also be varied. Therefore, the multiusability of the existing cabinet 9 can be enhanced.

As shown in FIGS. 7 to 10, each mounting unit 1 further includes a plurality of nuts 21, a plurality of positioning bolts 22 and a plurality of tightening fasteners 23. The nuts 21 are disposed in alignment with the post connecting holes 112a of the first panel flange 112 of the panel plate 11 (see FIG. 8) and with the post connecting holes 122a of the adjustment plate 12 (see FIG. 9). Some of the positioning bolts 22 extend through the post connecting holes 112a of the first panel flange 112 of the panel plate 11 and the post through holes 922 of the front support posts 921a and threadedly connect the nuts 21, so that the panel 11 is hung on the front support post 921a. The rest of the positioning bolts 22 extend through the post connecting holes 122a of the adjustment plate 12 and the post through holes 922 of the rear support post 921b and threadedly connect the nuts 21, so that the adjustment plate 12 is hung on the rear support post 921b. The tightening fasteners 23 are used to secure the post connecting holes 112a of the first panel flange 112 of the panel 11 to the post through holes 922 of the front support post 921a, and to secure the post connecting holes 122a of the adjustment plate 12 to the post through holes 922 of the rear support post 921b.

Figure 10:
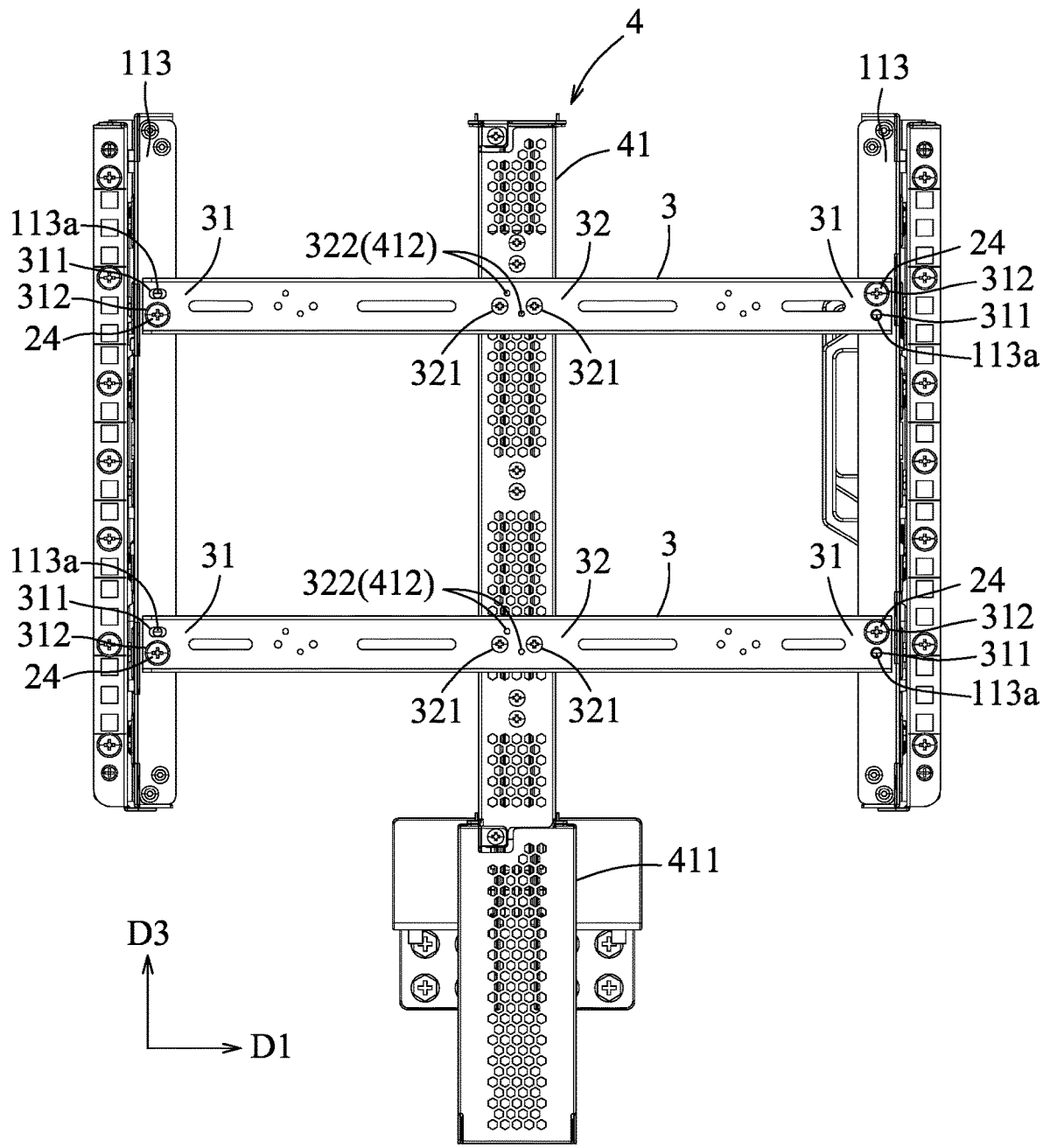
FIG. 10 is a rear view of the embodiment illustrating the mounting units, the bridge members, and the power supply module of the server rack assembly.

As shown in FIG. 10, the bridge members 3 are spaced apart from each other in the top-bottom direction (D3) and are connected to the second panel flanges 113 of the panels 11 of both of the mounting units 1 in a bridging manner. Each bridge member 3 is elongated, and has two opposite bridge ends 31 and a bridge body 32 interconnected between the bridge ends 31. Each bridge end 31 has a stud-receiving hole 311 to receive the positioning stud 113a, and a bridge through hole 312 to align with the flange through hole 113b.

The stud-receiving hole 311 and the bridge through hole 312 are disposed one above the other in the top-bottom direction (D3). In one of the bridge ends 31, the stud-receiving hole 311 is disposed above the bridge through hole 312. In the other one of the bridge ends 31, the stud-receiving hole 311 is disposed below the bridge through hole 312. When the bridge members 3 are assembled to the mounting units 1, the positioning studs 113a of the second panel flanges 113 of the panels 11 of the mounting units 1 are inserted into the stud-receiving holes 311 of the bridge members 3, and the flange through holes 113b of the second panel flange 113 of the panels 11 of the mounting units 1 align with the bridge through holes 312 of the bridge members 3.

The fastening unit 2 includes a plurality of fasteners 24. Each fastener 24 extends through and securing together the flange through hole 113b of the panel 11 of one of the mounting units 1 and the bridge through hole 312 of one of the bridge ends 31, so that the bridge members 3 are secured to the second panel flanges 113 of the panels 11 of the mounting units 1. The number of the bridge members 3 is not limited and may be varied.

Each bridge member 3 further has two installation holes 321 formed in the bridge body 32 for installation of the power supply module 4. As shown in FIG. 10, each power supply module 4 includes an electrical busbar 41 mounted to the bridge bodies 32 of the bridge members 3 and extending in the top-bottom direction (D3). The electrical busbar 41 is used for electrically coupling server devices and has a terminal member 411 for connecting to a power supply devices (not shown).

In this embodiment, each bridge member 3 further has two foolproof holes 322 formed in the bridge body 32 between the installation holes 321 and aligned along a line that is oblique to the left-right direction (D1) and the top-bottom direction (D3). One of the foolproof holes 322 is disposed below the left side of one of the installation holes 321 on the right. The other one of the foolproof holes 322 is disposed above the right side of the other one of the installation holes 321 on the left. The electrical busbar 41 further has two foolproof studs 412 respectively inserted into the foolproof holes 322. By virtue of the foolproof studs 412 and foolproof holes 322, the electrical busbar 41 is prevented from becoming upside down when being connected to the bridge members 3.

By virtue of the server rack assembly 100 of the disclosure, server devices and power supply devices may be arranged in different ways in the cabinet 9 depending on different requirements or different specifications of power supply devices. As shown in the upper portion of FIG. 2, the terminal member 411 of the electrical busbars 41 is situated below the bridge members 3 and is oriented downwardly to connect a power supply device (not shown) disposed below the server devices. To place the power supply device above the server devices, the terminal member 411 of the electrical busbars 41, as shown in the lower portion of FIG. 2, is situated above the bridge members 3 and is oriented upwardly.

Figure 11:
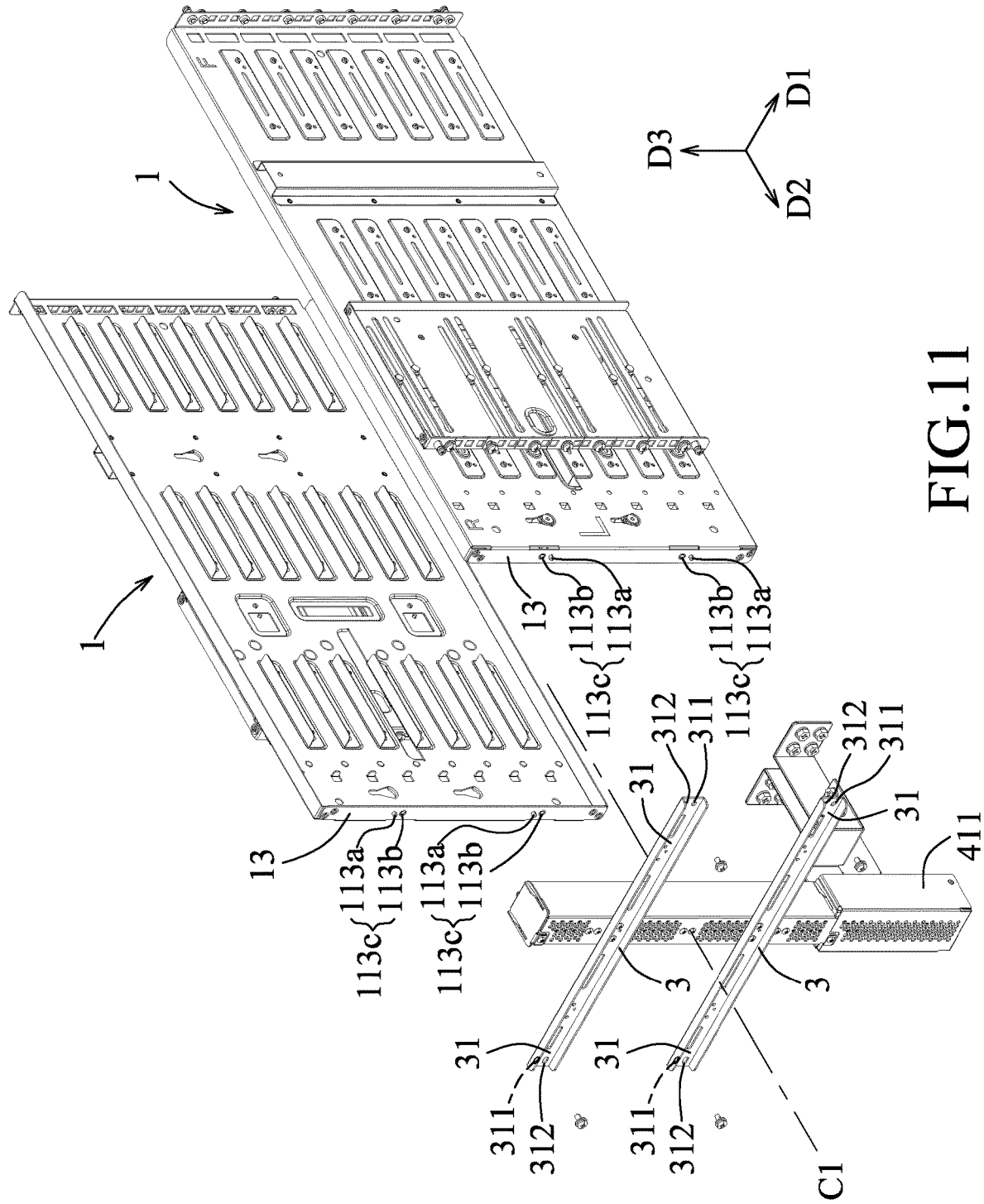
FIGS. 11 and 12 are perspective views illustrating the bridge members assembled with the power supply module before and after turning upside down.
Figure 12:
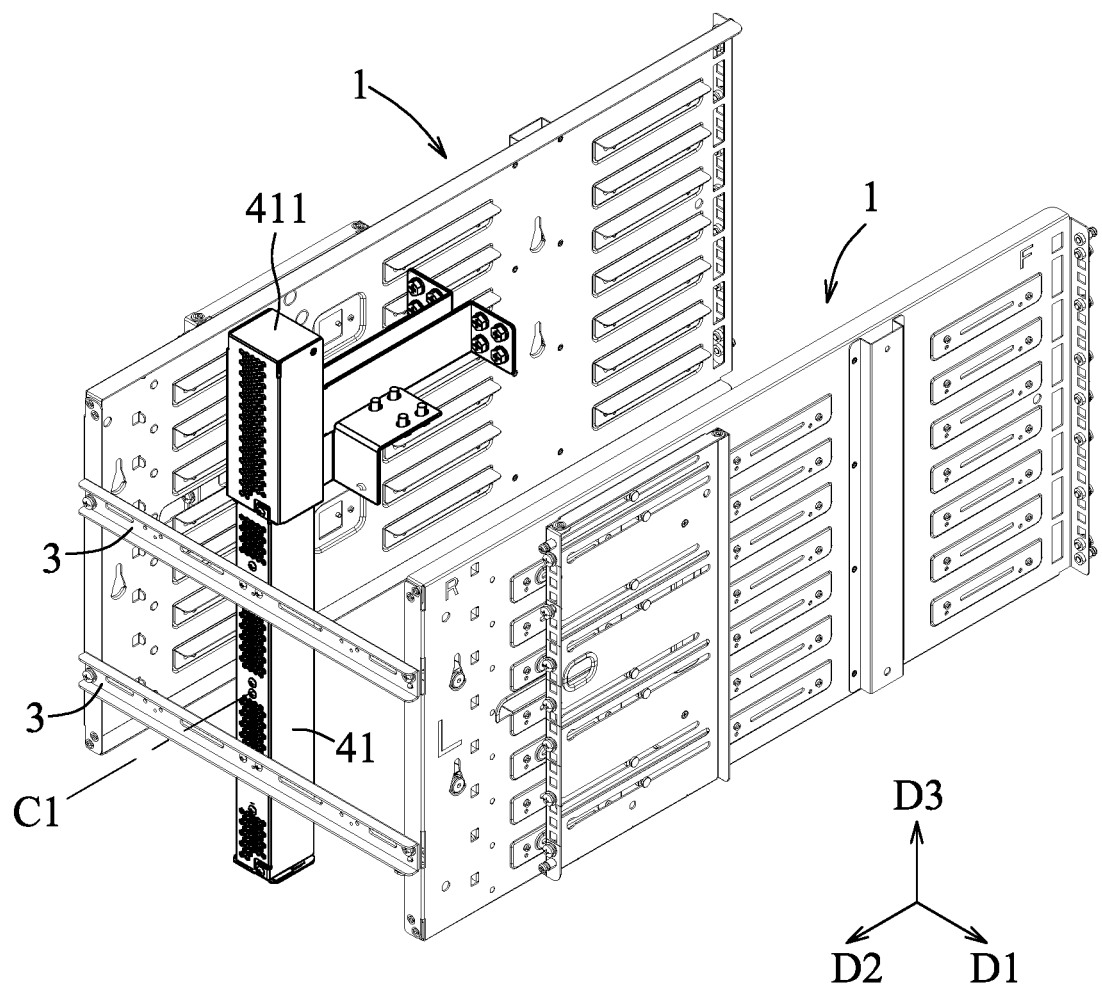

As shown in FIG. 11, the bridge members 3 together with the electrical busbar 41 are detached from the second panel flanges 113 of the panels 11 of the mounting units 1. Then, the bridge members 3 together with the electrical busbar 41 are turned upside down by rotating 180 degrees about an axis (C1) extending through the electrical busbar 41 and are re-attached to the second panel flanges 113 as shown in FIG. 12. Because the positional order of the stud-receiving hole 311 and the bridging through hole 312 in each bridge end 31 is opposite to that of the other bridge end 31, and because the positional order of the positioning stud 113a and the flange through hole 113b in the second panel flange 113 of the panel 11 of one of the mounting units 1 is opposite to that of the other mounting unit 1, the bridge members 3 assembled with the electrical busbar 41 can be quickly and directly re-attached to the second panel flanges 113 of the panels 11 of the mounting units 1 just by turning the bridge members 3 upside down.

To sum up, by means of the adjustment plates 12 moveable in the front-rear direction (D2) on the respective panels 11 for adjustment, the mounting units 1 are compatible with different distances between the front and rear support posts 921a, 921b and different depths of the cabinet 9. Because the rails 14 can be disposed at different desirable heights, the gaps 142 between the rails 14 are adjustable. Therefore, the mounting units 1 are able to accommodate server devices designed with the specifications involving either the unit "U" or the unit "OU." Further, by virtue of the particular arrangement of the stud-receiving holes 311 and the bridge through holes 312 in the bridge ends 31 of the bridge members 3 and the particular arrangement of the positioning studs 113a and the flange through holes 113b in the panels 11 of the mounting units 1, after the bridge members 3 assembled with the electrical busbar 41 are turned upside down, they still can be conveniently re-attached to the second panel flanges 113 of the panels 11 of the mounting units 1. Therefore, it is convenient to place the terminal member 411 of the electrical busbar 41 below or above a server device and to arrange a power supply device below or above the server device to meet different needs.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A server rack assembly mountable inside a server cabinet through two post units spaced apart from each other in a left-right direction, each of the post unit including a front support post and a rear support post spaced apart from each other in a front-rear direction, the server rack assembly including:
   a pair of mounting units configured to be respectively connected to the post units, each of said mounting units including
      a panel having a panel plate, a first panel flange and a second panel flange, said first and second panel flanges bending from said panel plate in two opposite directions, said first panel flange being configured to connect the front support post, said second panel flange having a positioning stud and a flange through hole which are disposed one above the other, wherein, in said panel of one of said mounting units, said positioning stud is disposed above said flange through hole, and in said panel of the other one of said mounting units, said positioning stud is disposed below said flange through hole,
      an adjustment plate connected to said panel plate, said adjustment plate being configured to connect the rear support post, and
      a plurality of rails detachably mounted on an inner surface of said panel at different heights, said inner surfaces of said panels of said mounting units facing toward each other, two adjacent ones of said rails on said panel having a gap therebetween that is adjustable to accommodate different heights of server devices, each of said rails on said panel of one of said mounting units corresponding in position along the left-right direction to one of said rails on said panel of the other one of said mounting units to cooperatively support the server device;
   at least one bridge member connected to said second panel flanges of said panels of both of said mounting units in a bridging manner, said at least one bridge member having two opposite bridge ends and a bridge body interconnected between said bridge ends, each of said bridge ends having a stud-receiving hole to receive said positioning stud, and a bridge through hole to align with said flange through hole, said stud-receiving hole and said bridge through hole being disposed one above the other, wherein, in one of said bridge ends, said stud-receiving hole is disposed above said bridge through hole, and in the other one of said bridge ends, said stud-receiving hole is disposed below said bridge through hole;
   a power supply module including an electrical busbar mounted to said bridge body and extending in a top-bottom direction, said electrical busbar having a terminal member for connecting to a power supply device; and
   a fastening unit including at least two fasteners, each of said at least two fasteners extending through and securing together said flange through hole of said panel of one of said mounting units and said bridge through hole of one of said bridge ends.

2. The server rack assembly as claimed in claim 1, wherein said adjustment plate is movable in the front-rear direction relative to said panel to adjust the position of said adjustment plate on said panel.

3. The server rack assembly as claimed in claim 1, wherein:
   said panel has an outer surface opposite to said inner surface, and a plurality of guiding studs protruding from said outer surface and spaced apart from each other in the top-bottom direction; and
   said adjustment plate has a plate portion and a plurality of sliding grooves formed in said plate portion and elongated in the front-rear direction, said guiding studs extending through said sliding grooves.

4. The server rack assembly as claimed in claim 3, wherein:
each of the front and rear support posts has a plurality of post through holes;
said adjustment plate further has a post-connecting portion bending outwardly from an end of said plate portion, said post-connecting portion having a plurality of post connecting holes arranged in the top-bottom direction, said post connecting holes of said adjustment plate being configured to align with the post through holes of the rear support post; and
said first panel flange has a plurality of post connecting holes arranged in the top-bottom direction and configured to align with the post through holes of the front support post.

5. The server rack assembly as claimed in claim 4, wherein:
each of said mounting units further includes a plurality of positioning bolts and a plurality of tightening fasteners;
some of said positioning bolts extend through said post connecting holes of said first panel flange of said panel plate and the post through holes of the front support posts, so that said panel is hung on the front support post;
the rest of said positioning bolts extend through said post connecting holes of said adjustment plate and the post through holes of the rear support post, so that said adjustment plate is hung on the rear support post; and
said tightening fasteners are used to secure said post connecting holes of said first panel flange of said panel to said post through holes of the front support post, and to secure said post connecting holes of said adjustment plate to the post through holes of the rear support post.

6. The rack assembly as claimed in claim 1, wherein:
each of said rails has a coupling portion and a protruding portion bending from said coupling portion; and
said panel further has a plurality of coupling recesses formed in said inner surface of said panel plate at different heights, each of said coupling recesses removably receiving said coupling portion of one of said rails.

7. The server rack assembly as claimed in claim 1, wherein each of said mounting units further includes at least one handle detachably mounted on said panel plate.

8. The server rack assembly as claimed in claim 1, wherein:
said at least one bridge member further has a plurality of foolproof holes formed in said bridge body and aligned along a line that is oblique to the left-right direction and the top-bottom direction; and
said electrical busbar further has a plurality of foolproof studs respectively inserted into said foolproof holes.

9. The server rack assembly as claimed in claim 6, wherein:
said coupling recesses are spaced apart from each other in the top-bottom direction; and
the number of said coupling recesses is greater than or equal to the number of said rails.

10. The server rack assembly as claimed in claim 7, wherein said at least one handle includes two handles mounted on said panel plate of said panel.

11. A server rack assembly, comprising:
two post units spaced apart from each other in a left-right direction, each of said post units including a front support post and a rear support post spaced apart from each other in a front-rear direction;
a pair of mounting units respectively connected to said post units, each of said mounting units including
a panel having a panel plate, a first panel flange and a second panel flange, said panel plate of said panel of one of said mounting units having an inner surface that faces said inner surface of said panel plate of the other one of said mounting units, said first panel flange being connected to one of said front and rear support posts,
an adjustment plate movably connected to an outer surface of said panel plate opposite to said inner surface and adjustable in position relative to said panel plate, said adjustment plate being connected to the other one of said front and rear support posts, and
a plurality of rails mounted on said inner surface of said panel at different heights, each of said rails on said panel of one of said mounting units corresponding in position in the left-right direction to one of said rails on said panel of the other one of said mounting units;
at least one bridge member connected to said second panel flanges of said panels of said mounting units in a bridging manner; and
a power supply module including an electrical busbar mounted to said bridge body and extending in a top-bottom direction, said electrical busbar having a terminal member.

12. The server rack assembly as claimed in claim 11, wherein:
said panel plate has a plurality of guiding studs protruding from said outer surface and spaced apart from each other in the top-bottom direction; and
said adjustment plate has a plate portion and a plurality of sliding grooves formed in said plate portion and elongated in the front-rear direction, said guiding studs extending through said sliding grooves.

13. The server rack assembly as claimed in claim 12, wherein said first and second panel flanges respectively bend from two opposite ends of said panel plate in two opposite directions.

14. The server rack assembly as claimed in claim 13, wherein:
each of said front and rear support posts has a plurality of post through holes;
said adjustment plate further has a post-connecting portion bending outwardly from an end of said plate portion, said post-connecting portion having a plurality of post connecting holes spaced apart in said top-bottom direction, said post connecting holes of said adjustment plate aligning with said post through holes of said rear support post; and
said first panel flange has a plurality of post connecting holes spaced apart from each other in said top-bottom direction and aligning with said post through holes of said front support post.

15. The server rack assembly as claimed in claim 11, wherein:
each of said rails has a coupling portion and a protruding portion bending from said coupling portion;
said panel further has a plurality of coupling recesses formed in said inner surface of said panel plate at different heights; and
said coupling portion of each of said rails is fixed in one of said coupling recesses.

16. The server rack assembly as claimed in claim 15, wherein said coupling portion of each of said rails is detachably fixed in one of said coupling recesses, adjacent two of said rails defining therebetween a gap which is adjustable, said coupling portions of adjacent two of said rails being respectively fixed in two of said coupling recesses which are selected to adjust said gap.

17. The server rack assembly as claimed in claim 11, wherein:
   said second panel flange has a positioning stud and a flange through hole which are disposed one above the other;
   in said panel of one of said mounting units, said positioning stud is disposed above said flange through hole;
   in said panel of the other one of said mounting units, said positioning stud is disposed below said flange through hole;
   said at least one bridge member has two opposite bridge ends and a bridge body interconnected between said bridge ends, each of said bridge ends having a stud-receiving hole to receive said positioning stud, and a bridge through hole to align with said flange through hole, said stud-receiving hole and said bridge through hole being disposed one above the other;
   for one of said bridge ends, said stud-receiving hole is disposed above said bridge through hole; and
   for the other one of said bridge ends, said stud-receiving hole is disposed below said bridge through hole.

18. The server rack assembly as claimed in claim 17, further comprising a fastening unit including at least two fasteners, each of said at least two fasteners extending through said flange through hole of said panel of one of said mounting units and said bridge through hole of one of said bridge ends.

19. The server rack assembly as claimed in claim 11, wherein each of said mounting units further includes at least one handle detachably mounted on said panel plate.

20. The server rack assembly as claimed in claim 19, wherein said at least one handle includes two handles mounted on said panel plate of said panel.

* * * * *